(12) United States Patent
Zhou et al.

(10) Patent No.: US 10,395,940 B1
(45) Date of Patent: Aug. 27, 2019

(54) METHOD OF ETCHING MICROELECTRONIC MECHANICAL SYSTEM FEATURES IN A SILICON WAFER

(71) Applicants: Toyota Motor Engineering & Manufacturing North America, Inc., Plano, TX (US); The Board of Trustees of the Leland Stanford Junior University, Stanford, CA (US)

(72) Inventors: Feng Zhou, South Lyon, MI (US); Ki Wook Jung, Santa Clara, CA (US); Ercan Mehmet Dede, Ann Arbor, MI (US); Mehdi Asheghi, Palo Alto, CA (US); Kenneth E. Goodson, Portola Valley, CA (US)

(73) Assignees: Toyota Motor Engineering & Manufacturing North America, Inc., Plano, TX (US); The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 15/919,889

(22) Filed: Mar. 13, 2018

(51) Int. Cl.
*H01L 21/308* (2006.01)
*B81C 1/00* (2006.01)

(52) U.S. Cl.
CPC ...... *H01L 21/3086* (2013.01); *B81C 1/00396* (2013.01); *B81C 1/00412* (2013.01);
(Continued)

(58) Field of Classification Search
CPC ..... B81B 1/002; B81B 1/004; B81B 2201/05; B81B 2201/058; B81C 1/00523;
(Continued)

(56) References Cited

U.S. PATENT DOCUMENTS

| 5,421,952 A | 6/1995 | Buchholz et al. |
| 5,501,893 A | 3/1996 | Laermer et al. |

(Continued)

FOREIGN PATENT DOCUMENTS

| JP | 10321875 A | 12/1998 |
| JP | 2007216474 A | 8/2007 |

OTHER PUBLICATIONS

Kim et al., "Fabrication of a vertical sidewall using double-sided anisotropic etching of <1 0 0> oriented silicon", Journal of Micromechanics and Microengineering, Published Jul. 27, 2012, 3 pages, vol. 22, No. 9, IOP Publishing Ltd.

*Primary Examiner* — Stephen W Smoot
(74) *Attorney, Agent, or Firm* — Dinsmore & Shohl, LLP

(57) ABSTRACT

A method of etching features in a silicon wafer includes coating a top surface and a bottom surface of the silicon wafer with a mask layer having a lower etch rate than an etch rate of the silicon wafer, removing one or more portions of the mask layer to form a mask pattern in the mask layer on the top surface and the bottom surface of the silicon wafer, etching one or more top surface features into the top surface of the silicon wafer through the mask pattern to a depth plane located between the top surface and the bottom surface of the silicon wafer at a depth from the top surface, coating the top surface and the one or more top surface features with a metallic coating, and etching one or more bottom surface features into the bottom surface of the silicon wafer through the mask pattern to the target depth plane.

20 Claims, 9 Drawing Sheets

(52) U.S. Cl.
CPC ...... *B81C 1/00523* (2013.01); *B81C 1/00531* (2013.01); *B81C 1/00563* (2013.01); *B81C 1/00603* (2013.01); *H01L 21/3081* (2013.01); *B81C 2201/0132* (2013.01); *B81C 2201/0135* (2013.01)

(58) Field of Classification Search
CPC ............ B81C 1/00531; B81C 1/00563; B81C 1/00587; B81C 1/00603; B81C 2201/0132; B81C 2201/0135; B81C 2201/0142
See application file for complete search history.

(56) References Cited

U.S. PATENT DOCUMENTS

| | | | |
|---|---|---|---|
| 6,663,231 B2 * | 12/2003 | Lee ................. | B41J 2/1433 347/68 |
| 6,716,661 B2 * | 4/2004 | Zou ................. | B81C 1/00214 438/456 |
| 6,773,942 B2 | 8/2004 | Tu | |
| 6,818,464 B2 | 11/2004 | Herschel | |
| 6,821,901 B2 * | 11/2004 | Song ............... | B81C 1/00087 257/E21.232 |
| 6,902,867 B2 * | 6/2005 | Hall ................. | B41J 2/1603 216/27 |
| 6,951,622 B2 * | 10/2005 | Chung ............. | B41J 2/1603 216/27 |
| 7,190,854 B1 * | 3/2007 | Novotny .......... | G02B 6/3518 385/18 |
| 7,670,529 B2 | 3/2010 | Choi et al. | |
| 2003/0137559 A1 * | 7/2003 | Chen ............... | B41J 2/14129 347/48 |
| 2007/0034356 A1 * | 2/2007 | Kenny ............. | F04B 17/00 165/80.4 |
| 2009/0014296 A1 * | 1/2009 | Weber ............. | H01H 1/0036 200/181 |
| 2016/0031216 A1 * | 2/2016 | Friesen ........... | B41J 2/1603 347/44 |

\* cited by examiner

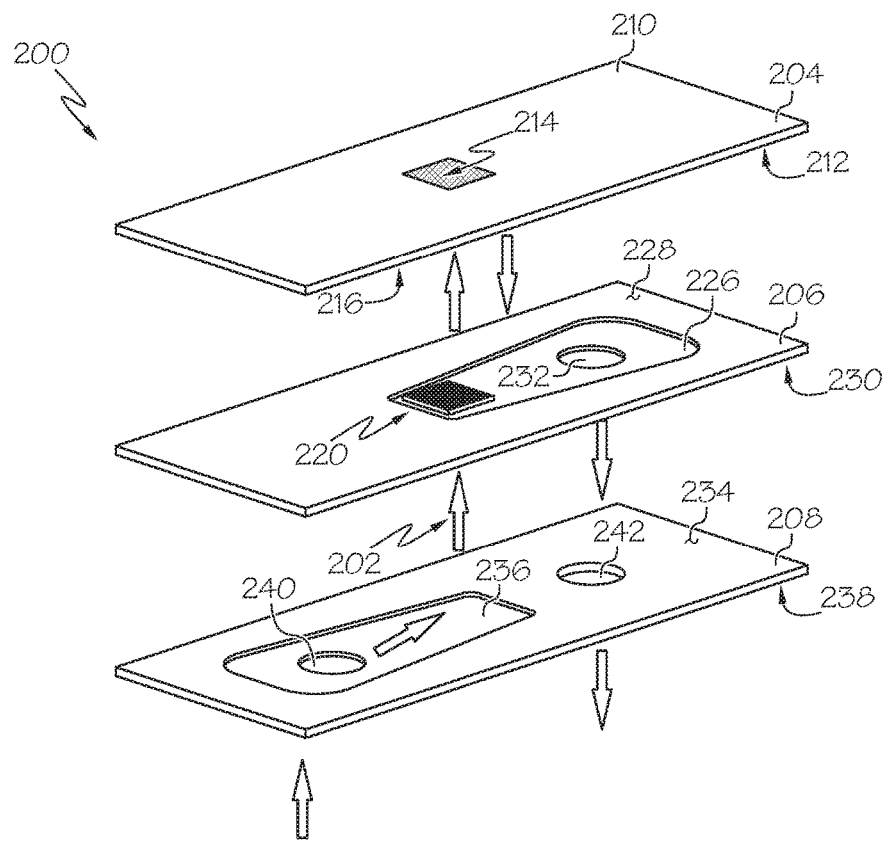
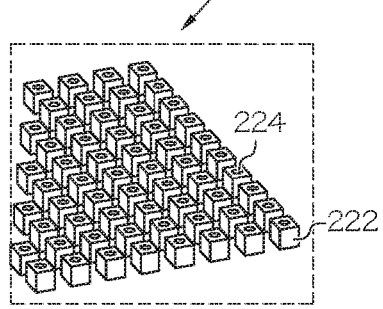
FIG. 4B
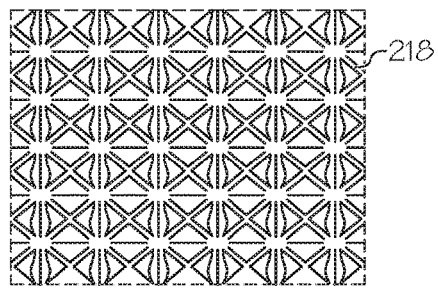
FIG. 4C
FIG. 4A

US 10,395,940 B1

METHOD OF ETCHING MICROELECTRONIC MECHANICAL SYSTEM FEATURES IN A SILICON WAFER

TECHNICAL FIELD

The present specification generally relates to methods of etching features into silicon substrates and, more specifically, to methods of etching silicon substrates using metal layers and/or a specific order of steps.

BACKGROUND

Microelectronic mechanical systems ("MEMS") may be formed by etching features into one or more silicon wafers. Features may be etched in a silicon wafer using a number of techniques. One such technique is anisotropic deep silicon etching. For example, micro- or nanopillar arrays, accelerometers, complementary metal-oxide semiconductors, and micro- or nanofluidic devices may have one or more features that have been formed using anisotropic deep silicon etching.

SUMMARY

In one embodiment, a method of etching features in a silicon wafer includes coating a top surface and a bottom surface of the silicon wafer with a mask layer having a lower etch rate than an etch rate of the silicon wafer, removing one or more portions of the mask layer to form a mask pattern in the mask layer on the top surface and the bottom surface of the silicon wafer, etching one or more top surface features into the top surface of the silicon wafer through the mask pattern to a depth plane located between the top surface and the bottom surface of the silicon wafer at a depth from the top surface, coating the top surface and the one or more top surface features with a metallic coating, and etching one or more bottom surface features into the bottom surface of the silicon wafer through the mask pattern to the target depth plane.

In another embodiment, a method of etching one or more features in a silicon wafer includes coating a top surface and a bottom surface of the silicon wafer with a mask layer having a lower etch rate than an etch rate of the silicon wafer, removing one or more portions of the mask layer to form a mask pattern in the mask layer on the top surface and the bottom surface of the silicon wafer, etching one or more bottom surface features into the bottom surface of the silicon wafer through the mask pattern to a target depth plane located between the top surface and the bottom surface of the silicon wafer at a target depth from the top surface, coating the bottom surface and the one or more bottom surface features etched into the bottom surface with a metallic coating, and etching one or more top surface features into the top surface of the silicon wafer through the mask pattern to the target depth plane.

In yet another embodiment, a method of etching one or more through-features into a silicon wafer including a top surface and a bottom surface and coated in a mask layer is described. The one or more through-features include one or more nozzle through-holes, an outlet plenum, and a cooling fluid outlet. The method includes forming a mask pattern in a mask layer top surface and a mask layer bottom surface of the mask layer, etching a bottom portion of the one or more nozzle through-holes from the bottom surface to a nozzle target depth through the mask layer bottom surface, etching the cooling fluid outlet from the bottom surface to the plenum target depth through the mask layer top surface, coating the bottom surface and the bottom portion of the one or more nozzle through-holes and the cooling fluid outlet with a metallic coating, etching a top portion of the one or more nozzle through-holes from the top surface to the nozzle target depth, and etching the outlet plenum from the top surface to a plenum target depth. The first of the one or more through-features to etch through the silicon wafer is completed at an initial through-etch time, and the last of the one or more through-features to etch through the silicon wafer is completed at an etch completion time.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4A schematically depicts an exploded view of an example embodiment of a multi-substrate layer cooling device including a nozzle array and a cooling channel array, according to one or more embodiments shown and described herein:

FIG. 4B schematically depicts a detailed view of the nozzle array of the multi-substrate layer cooling device of FIG. 4A, according to one or more embodiments shown and described herein;

FIG. 4C schematically depicts a detailed view of the cooling channel array of the multi-substrate layer cooling device of FIG. 4A, according to one or more embodiments shown and described herein:

DETAILED DESCRIPTION

Figure 1A:
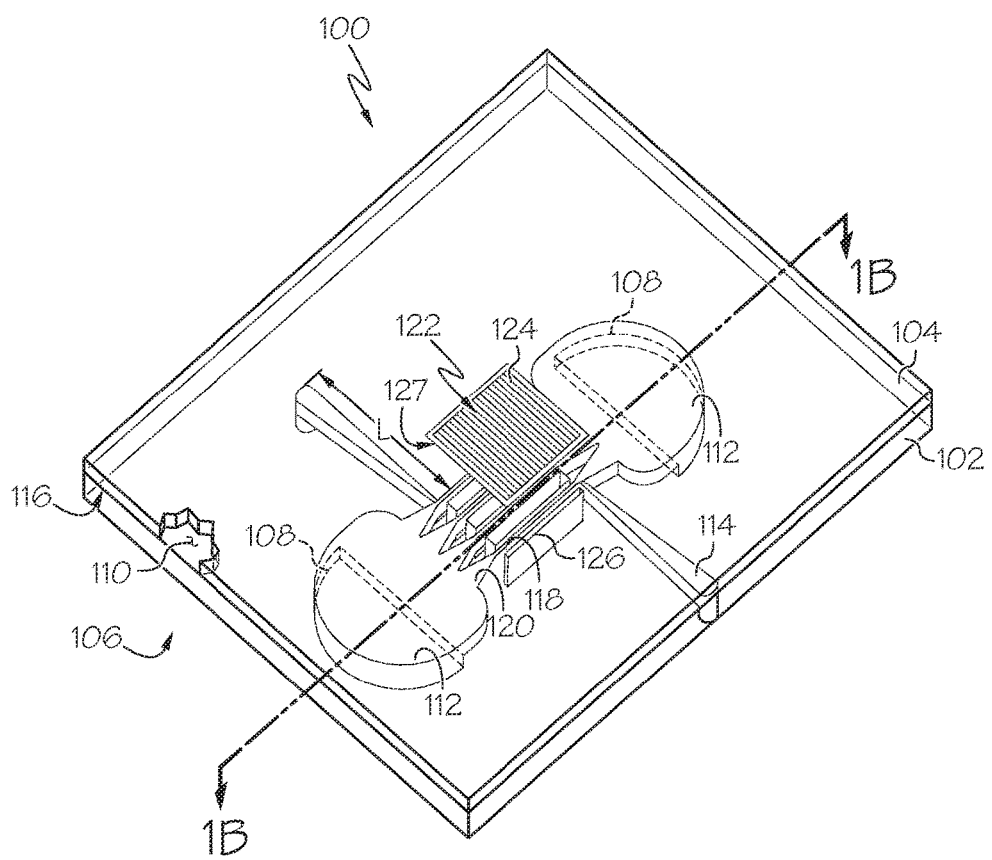
FIG. 1A schematically depicts an example embodiment of an embedded micro-channel cooling system including a manifold substrate and a cooling substrate, according to one or more embodiments shown and described herein.

Embodiments described herein relate to methods of forming a chip-scale cooling device from a silicon wafer by using an anisotropic etching method on both sides of the silicon wafer. The chip-scale cooling device may be integrated with a power semiconductor device. Power semiconductor devices, such as diodes, switches, and amplifiers generate large amounts of heat during operation. Power semiconductor devices, particularly SiC and GaN devices, may switch relatively high levels of current on and off at a high speeds and generate relatively high levels of heat due to operational losses. Accordingly, large amounts of heat may be removed from the devices during operation. Such large amounts of heat may be removed by integrating one or more chip-scale cooling devices with the power semiconductor device.

Further, heat reduction of the power semiconductor device may be augmented using one or more heat removal features formed in the cooling device, such as arrays of cooling channels and cooling fluid flow to conduct heat away from the power semiconductor device or other heat generating device. The chip-scale cooling device may include features such as a cooling fluid flow path, one or more nozzle structures, one or more through-silicon vias (TSVs), and one or more cooling channel arrays. The one or more nozzles may impinge fluid onto the array of cooling channels. The cooling fluid may even change phase as it passes through the nozzle to remove an even greater quantity of heat from the heat generating device. It is noted that the concepts described herein may be used to cool any type of semiconductor device and are not limited to power semiconductor devices.

The methods described herein involve etching features of the chip-scale cooling device into opposite surfaces of the device, one surface at a time, to ensure particular shape and/or thickness characteristics, and to preserve the structural integrity of the device. The order that the opposite surfaces are etched may be chosen based on a number of criteria. Additionally, one or more layers may be added to a first-etched surface before the second-etched surface is etched. This may neutralize unwanted etching in the first-etched surface. Such features and processes will be described in greater detail herein.

Anisotropic etching is etching in which the etch rate is different in one dimension (e.g., a lateral etch rate) than in another dimension (e.g., a through-wafer etch rate). Features with high aspect ratios may be achieved using anisotropic deep silicon etching techniques because it may be possible to etch through the wafer at a higher rate than along the surface of the wafer. However, etching from a single side of a wafer may have particular challenges that require various techniques to overcome.

One useful anisotropic silicon etching technique is a time-multiplexed alternating process (also known as a "Bosch process"). This technique may be used for etching relatively deep and relatively narrow features through thick silicon substrates. However, current time-multiplexed alternating processes may have certain limitations.

For example, in substrates having a pattern of individually etched features with a small pitch between each feature, such as a pattern of TSVs, the wall between each feature may be thin, which may lead to structural instability. If the depth of the feature to be etched is greater than the thickness of the wall between each of the individual features, the lateral etch rate may be tightly controlled with respect to the through-wafer etch rate to ensure that the dimensions of each feature do not interfere with one another and result in one large, overlapping, indistinct feature. Complicating the problem, in features with high aspect ratios, the lateral etch rate may increase with increasing etch depth within the wafer. This may result in lowering wall thicknesses and structural instability between etched features near the bottom of the etched features (i.e., at the side opposite where the etch began).

Additionally, to etch features deeply into silicon substrates, the silicon substrates may be exposed to chemical etchants for long periods of time. As a result, portions of the substrate that will not be etched may require thick mask layers, which will slowly erode as the substrate is etched. Hence, thick silicon-oxide mask layers may be applied to the substrate before the etching can begin. The thicker the mask layer, the more difficult it may be to apply and subsequently remove select portions of the silicon-oxide mask layer to etch the design features.

Further, for features etched in a substrate with different aspect ratios (e.g., a wide inlet plenum and a TSV), it may be difficult to balance the etch rates of each of the features to ensure that the features are not over etched, thus exceeding or otherwise not meeting engineered specifications. Moreover, if a particular feature is completely etched before another connecting feature, the gases used to etch the features may bleed through the first-etched feature into the second-etched feature, thereby interfering with the etch of the second-etched feature (e.g., increasing the lateral etch rate of the second-etched feature).

Even more, in etching methods that utilize two-sided etching to etch one or more holes through the entire substrate, gases may diffuse through the etched hole once the hole passes completely through the substrate (i.e., both sides are completely etched through). If the substrate is mounted to a supporting wafer using mounting oil, the gas used to etch the substrate may diffuse through the hole formed before completion of one or more of the remaining features. The gas may then interact with the mounting oil, causing a waste product to be generated. This waste product may be hard to remove using methods such as wafer cleaning or plasma ashing. Therefore, it may be advantageous to etch from both sides of a wafer when forming a semiconductor device from a silicon wafer (e.g., a power semiconductor device). Additionally, the side of the silicon wafer from which the etching process begins may be selected based on one or more aspects of the features on the wafer to be etched and/or based on aspects of the wafer itself.

For example, the number of individual features to be etched into the top surface or into the bottom surface may be a factor in whether to etch from the top surface or the bottom surface first. Additionally, the aspect ratio of the features to be etched into the top surface and the bottom surface may be a factor in whether to etch from the top surface or the bottom surface first.

The features of the chip-scale cooling device may be etched into a silicon substrate or wafer using an anisotropic deep etching technique. Various problems may be associated with anisotropic deep silicon etching that may be solved using the various techniques described herein. For example, all through-wafer features may be etched by starting the etching at both sides of the substrate thereby reducing the etch depth required for a given through-wafer feature on either side of the substrate and reducing the required thickness of the mask layer. Additionally, because etched features need only extend a fraction of what they would need to be etched if they were etched through a single side of the substrate, it may be easier to balance the vertical etch rate and the lateral etch rate through the etch. Thus, features etched through the thickness of the substrate are subject to less lateral etch creep. Moreover, because the thickness of the mask layer is reduced, it may be easier to form openings in the mask layer, reducing the overall difficulty of forming openings to etch subsequent features in the mask layer. Each of these developments may reduce the time and resource cost of etching new silicon chips, thereby decreasing the cost of production for an individual chip and increasing production efficiency.

Embodiments described herein include reducing unwanted etching in a silicon wafer by coating surfaces of the wafer that have been etched with a passivation layer (e.g., sputtered aluminum), before etching from an opposite side of the wafer. Coated surfaces will not react with a chemical etchant that may inadvertently contact the coated surface. Therefore, the dimensions of the coated surfaces can be more tightly controlled, resulting in greater precision in etched features and better functionality of the systems they form.

FIG. 1A shows an example embodiment of an embedded micro-channel cooling system 100 including a manifold substrate 102 and a cooling substrate 104. In embodiments, the manifold substrate 102 and the cooling substrate 104 may be aligned and directly bonded to one another, as depicted in FIG. 1A. The embedded micro-channel cooling system 100 may be used to cool one or more semiconductor devices, such as, for example, one or more power semiconductor devices.

Non-limiting examples of power semiconductor devices that may be cooled by the embedded micro-channel cooling system 100 described herein include, but are not limited to, SiC semiconductors, GaN semiconductors, or other types of semiconductor devices that provide large bandgaps, high breakdown voltages, and high thermal conductivity. Power semiconductor devices may be capable of greater capacity in particular aspects than other semiconductor devices, such as higher blocking voltages, higher switching frequencies, and higher junction temperatures. Consequently, they may also require greater cooling capacity. Implementations of power semiconductors may include, but are not limited to, bipolar junction transistors (BJTs), insulated-gate bipolar transistors (IGBTs), and power metal-oxide-semiconductor field-effect transistors (MOSFETs). Power semiconductors may be used as power supplies, for example, as the power supply for an electric vehicle.

Components of the embedded micro-channel cooling system 100 may be etched from one or more silicon-oxide or silicon wafers. Briefly referring to FIG. 2, the wafers used to create the one or more features and components of the embedded micro-channel cooling system 100 may comprise a silicon wafer 136 surrounded by a silicon-oxide mask layer 138. The components and features of the embedded micro-channel cooling system 100 may be etched from the wafers using one or more etching processes, as described herein.

Figure 1B:
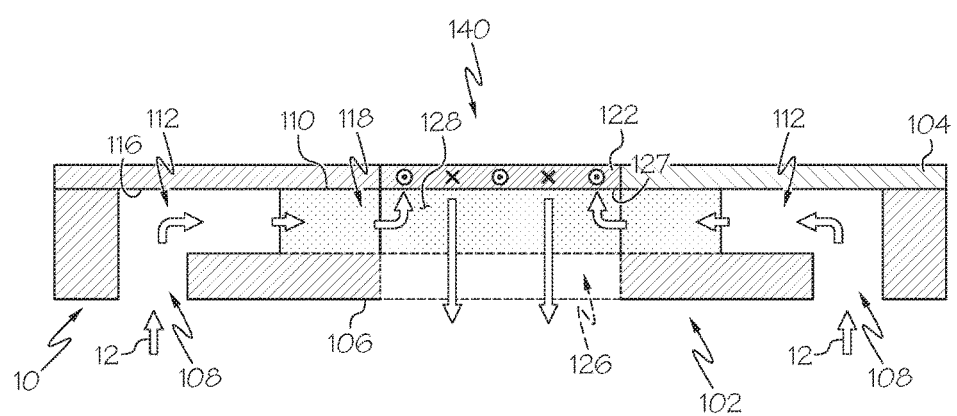
FIG. 1B schematically depicts a cross-sectional view of the embedded micro-channel cooling system of FIG. 1A along the line 1B-1B of FIG. 1A, according to one or more embodiments shown and described herein.

Referring to FIGS. 1A and 1B, the manifold substrate 102 may include a bottom surface 106 that includes one or more inlet holes 108 and a top surface 110 that includes one or more inlet manifolds 112. The inlet manifolds 112 may be a three-dimensional void or space for receiving cooling fluid in the manifold substrate 102 before the cooling fluid is used in an embedded micro-channel cooling array 122 of the cooling substrate 104 to cool one or more power semiconductor devices that may be coupled to the cooling substrate 104 at a cooling location 140. The inlet holes 108 and the inlet manifolds 112 may be an inlet portion of a cooling fluid flow path 10 represented by arrows 12 in FIG. 1B. As shown in FIG. 1A, the inlet manifolds 112, or portions thereof, may be rounded to minimize disturbance or turbulence in the cooling fluid flow.

Still referring to FIGS. 1A and 1B, the inlet holes 108 may be etched into the bottom surface 106 of the manifold substrate 102. In non-limiting example embodiments, the inlet holes 108 may be circular or semi-circular in shape. The inlet holes 108 may extend from the bottom surface 106 to the inlet manifolds 112, thereby fluidly coupling an external system that contains cooling fluid to the inlet manifolds 112 through the inlet holes 108, and ultimately fluidly coupling the external system to an embedded micro-channel cooling array 122 in the cooling substrate 104.

The inlet manifolds 112 may be etched in the top surface 110 of the manifold substrate 102. In the non-limiting example embodiment shown in FIG. 1A, the inlet manifolds 112 are rounded etched portions of the manifold substrate 102. The inlet manifolds 112 may be etched into the manifold substrate 102 using an etching procedure such as the example etching procedure described herein. As shown in FIG. 1B, the top of the inlet manifold 112 may be sealed by a bottom surface 116 of the cooling substrate 104. Thus, the bottom surface 106 of the cooling substrate 104 may prevent cooling fluid from escaping from the inlet manifold 112, which together with the inlet holes 108 form a void that passes through the entire thickness of the manifold substrate 102. The bottom surface 116 thus forms a portion of the cooling fluid flow path 10 and ensures that cooling fluid flows through the cooling fluid flow path 10, as depicted in FIG. 1B.

Referring to FIG. 1A, the manifold substrate 102 may also include one or more auxiliary channels 114 integrated therein. Each of the auxiliary channels 114 may be a channel that receives one or more testing apparatuses that are used to test one or more aspects of the cooling fluid flowing through the cooling fluid flow path 10. For example, the auxiliary channels 114 may enable testing of a pressure and a velocity of the cooling fluid in the cooling fluid flow path 10 (shown in FIG. 1B) using a differential pressure detector. The auxiliary channels 114 may have a generally tapered profile along their length dimension L. The profile may taper along the length dimension L toward the cooling fluid inlet channel opening 120.

The inlet manifolds 112 may be fluidly coupled to the one or more cooling fluid inlet channels 118. The cooling fluid inlet channel openings may have a relatively wide inlet profile and a relatively narrow exit profile through the cooling fluid inlet channel opening 120 (e.g., a triangular-shaped profile). This profile may increase flow velocity through the cooling fluid inlet channel opening 120, may decrease the pressure of the cooling fluid that may flow through the cooling fluid inlet channel opening 120, or both.

The cooling fluid inlet channels 118 may fluidly couple the inlet manifolds 112 with an embedded micro-channel cooling array 122 in the cooling substrate 104. The embedded micro-channel cooling array 122 may include embedded micro-channel cooling array inlets and embedded micro-channel cooling array outlets (i.e., inlet and outlet holes) on a fluid-coupling side 127 of the embedded micro-channel cooling array 122. The embedded micro-channel cooling array inlets and embedded micro-channel cooling array outlets may fluidly couple one or more embedded micro-channel cooling array cooling channels 124 with the features in the manifold substrate 102 that comprise the cooling fluid flow path 10 shown in FIG. 1B. The embedded micro-channel cooling array 122 may be thermally coupled to one or more power semiconductor devices at the cooling location 140 above the embedded micro-channel cooling array 122 shown in FIG. 1B. The embedded micro-channel cooling array 122 may remove heat generated by the one or more power semiconductor devices and transfer it to the cooling fluid. The embedded micro-channel cooling array outlets may be fluidly coupled with one or more cooling fluid outlet channels 126 in the manifold substrate 102 such that the embedded micro-channel cooling array outlets create a path for cooling fluid to flow from the embedded micro-channel cooling array cooling channels 124 in the embedded micro-channel cooling array 122 to the one or more cooling fluid outlet channels 126 in the manifold substrate 102.

The cooling fluid outlet channels 126 in the manifold substrate 102 may be one or more rectangular etched voids etched from the manifold substrate 102 to create an outlet path for the cooling fluid after the cooling fluid flows through the embedded micro-channel cooling array 122. As shown in FIG. 1A, some of the cooling fluid outlet channels 126 may be located between cooling fluid inlet channels 118. The non-etched portion of the manifold substrate 102 between the cooling fluid inlet channels 118 and the cooling fluid outlet channels 126 may include a manifold substrate wall 128. The manifold substrate wall 128 may create a barrier that prevents cooling fluid from flowing directly from the cooling fluid inlet channels 118 to the cooling fluid outlet channels 126 and thereby bypassing the embedded micro-channel cooling array 122. Said another way, the manifold substrate wall 128 ensures that cooling fluid flows to the embedded micro-channel cooling array 122 by preventing cooling fluid from entering the cooling fluid outlet channels 126 until it has passed through the embedded micro-channel cooling array 122. The thickness of the manifold substrate wall 128 may be affected by aspects of the etching process, such as vertical and lateral etching rates, as described in greater detail herein.

The cooling fluid outlet channels 126 may be fluidly coupled to one or more external cooling fluid systems. The cooling fluid may exit the manifold substrate 102 through the cooling fluid outlet channels 126 and flow to the one or more external cooling fluid systems. As a non-limiting example, the cooling fluid may exit the cooling fluid outlet channels 126 to one or more external heat exchangers, such as a radiator, to one or more cooling fluid reservoirs, to one or more cooling fluid recycling systems, or to one or more other cooling fluid systems.

Referring to FIG. 1B, the cooling fluid flow path 10 will be described. The cooling fluid flowing through the manifold substrate 102 flows along the cooling fluid flow path 10. The cooling fluid flow path 10 starts with cooling fluid flowing from an external system, such as a radiator system or a cooling fluid reservoir, for example. The cooling fluid flows into the manifold substrate 102 through the cooling fluid inlet holes 108. The cooling fluid that flows into the manifold substrate 102 will be relatively cold, because it has not yet absorbed heat from the power semiconductor device or other heat generating device coupled to the cooling substrate 104. As shown in FIG. 1B, the manifold substrate 102 may include two inlet holes 108, but embodiments that comprise fewer or more than two inlet holes 108 are contemplated. The cooling fluid may flow upward from the inlet holes 108 to the inlet manifolds 112. From the inlet manifolds 112, the cooling fluid may flow inward toward the cooling fluid inlet channels 118.

In the cooling fluid inlet channels 118, the cooling fluid flows upward to inlet holes in the micro-channel cooling array 122 (not shown, because they are on a downward-facing side of the micro-channel cooling array 122). The cooling fluid then flows in the micro channels of the micro-channel cooling array, where it absorbs heat from the power semiconductor device or other heat generating device before it flows out of the micro channels through the outlet holes in the micro-channel cooling array 122 (not shown, because they are on a downward facing side of the micro-channel cooling array 122). From the micro-channel cooling array 122, the cooling fluid flows out of the manifold substrate 102 through the cooling fluid outlet channels 126 to an external system, such as a radiator system or a cooling fluid reservoir.

The cooling fluid that flows through the embedded micro-channel cooling system 100 may include, as one example, deionized water. Other exemplary fluids include, without limitation, water, organic solvents, and inorganic solvents. Examples of such solvents may include commercial refrigerants such as R-134a, R717, and R744. Moreover, in some embodiments, the cooling fluid may be a dielectric cooling fluid. Non-limiting dielectric cooling fluids other than deionized water include R-245fa and HFE-7100. The type of cooling fluid chosen may depend on the operating temperature of the one or more power semiconductor devices to be cooled. Further, selection of the composition of the cooling fluid may be based on, among other properties, the boiling point, the density, and/or the viscosity of the cooling fluid.

The manifold substrate 102 may be bonded to the cooling substrate 104. As a non-limiting example, the manifold substrate 102 and the cooling substrate 104 may be directly bonded. As used herein, the term "directly bonded" or a "direct bond" (also referred to as "silicon direct bond" or "silicon fusion bond") means a bond between layers of silicon substrate, such as the manifold substrate 102 and the cooling substrate 104, without an additional layer between the two layers. The manifold substrate 102 and the cooling substrate 104 may be bonded to create the cooling fluid flow path described herein.

Figure 2:
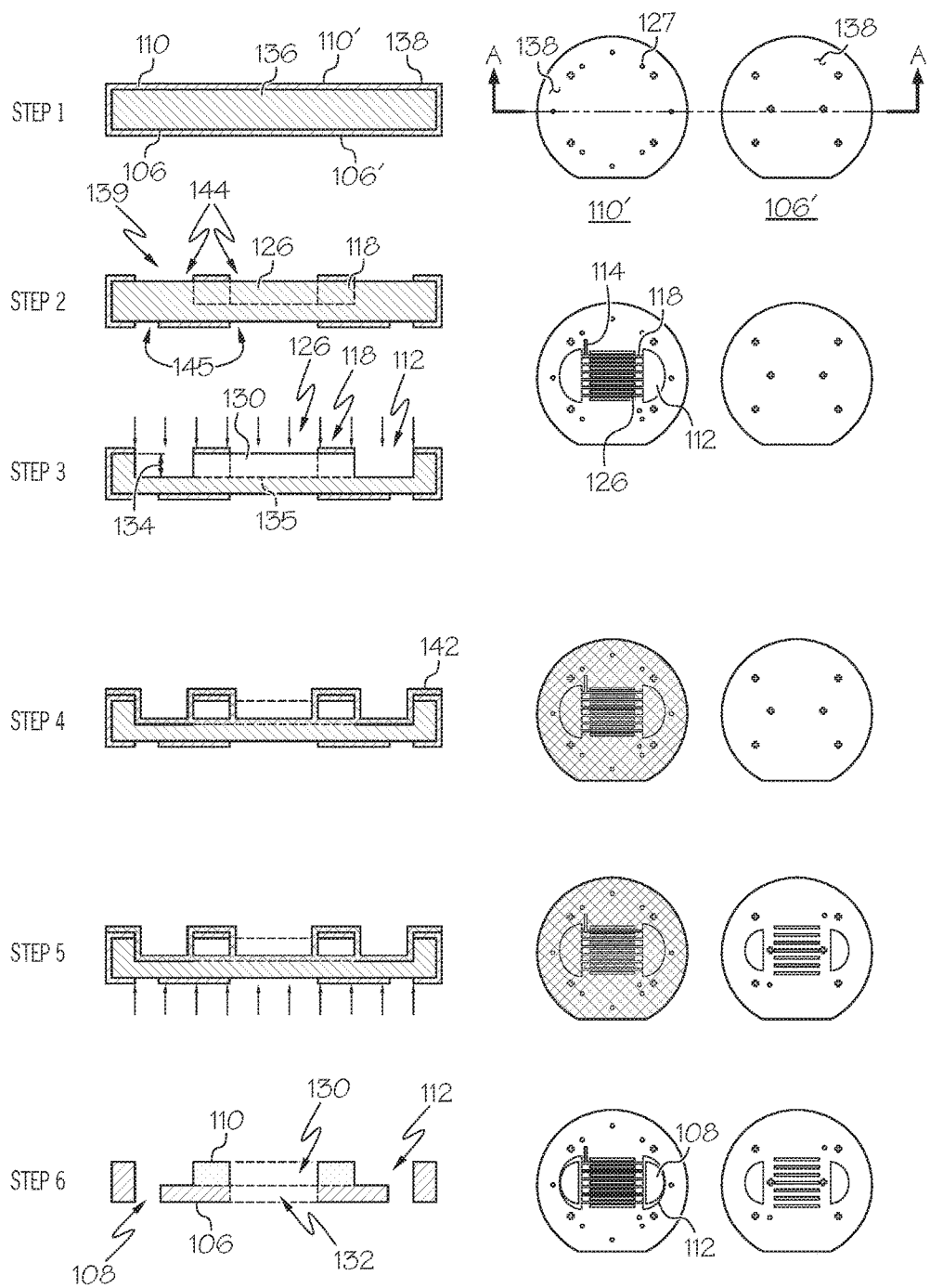
FIG. 2 schematically depicts an example process for etching the example embodiment of the embedded micro-channel cooling system of FIG. 1A, according to one or more embodiments shown and described herein.

In some embodiments, before the manifold substrate 102 and the cooling substrate 104 are bonded, they may be aligned. To align the manifold substrate 102 and the cooling substrate 104, a vision-assist aligning procedure using a machine vision system and/or machine vision may be used. The machine vision system may include one or more optical or infrared cameras designed to detect one or more fiducial marks 127, as shown in FIG. 2, on the substrate layers and/or one or more visual or infrared light sources to illuminate the one or more fiducial marks 127 in visual or infrared light. The visual or infrared light source may illuminate the one or more fiducial marks to increase the contrast of the fiducial mark 127 from the substrate layer or other feature where the fiducial mark 127 is located. The fiducial mark 127 or marks may comprise one or more opaque or other markings on a surface or other feature of a substrate layer and a real-time image capture of the fiducial mark 127 may be compared to a reference image to align the substrate layer or layers and the features thereon.

Figure 3:
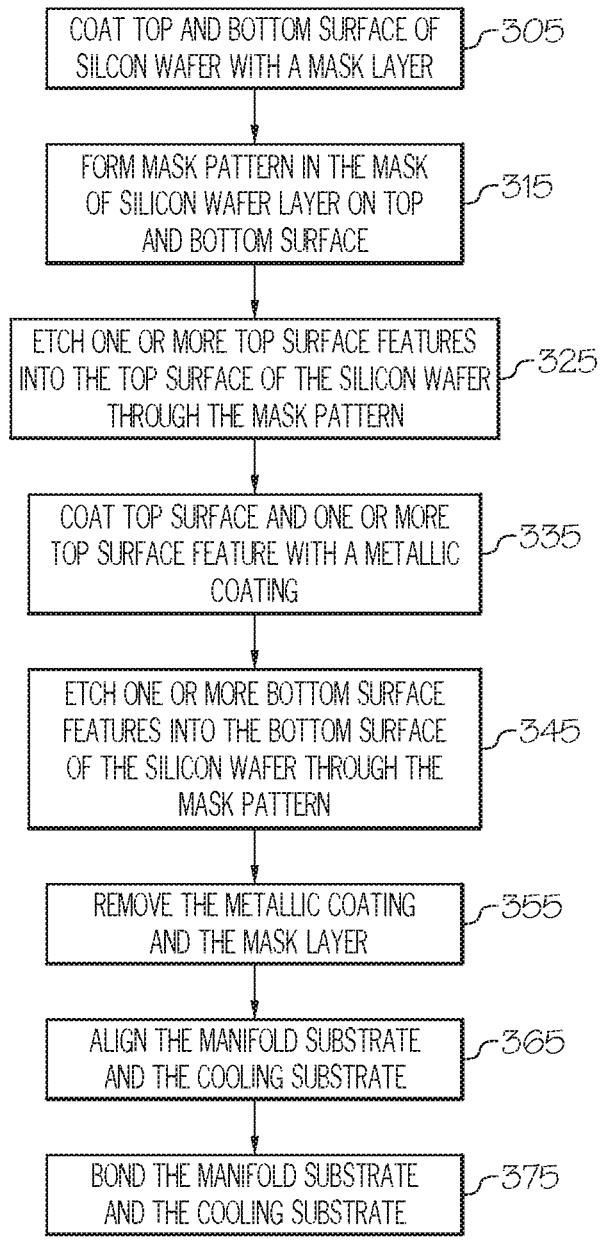
FIG. 3 depicts a flow diagram of the example process of FIG. 2, according to one or more embodiments shown and described herein.

Still referring to FIG. 2, one example process for etching features, such as, for example, the features described herein, into the silicon wafer 136 is shown. FIG. 3 depicts a flow diagram of the example process shown in FIG. 2. The example process described herein may be used, for example, to create the manifold substrate 102 described herein.

Accordingly, Steps 1-6 in FIG. 2 show an example process for making the manifold substrate 102, but it is to be understood that the principles and explicit steps disclosed herein could be used to etch other features into one or more silicon wafers. Examples of etching processes may include chemical etching processes using a liquid or gas etchant.

Referring to both FIGS. 2 and 3, before the silicon wafer 136 is etched, the silicon wafer 136 may be coated with a mask layer at block 305 and shown at Step 1. For example, the silicon wafer may be coated with a silicon-oxide mask layer 138 such that portions of the silicon wafer 136 that need not be etched during a particular step are protected by the silicon-oxide mask layer 138 and are not etched. In some embodiments, the silicon-oxide mask layer 138 may coat substantially all surfaces of the silicon wafer 136. As shown in FIG. 2, step 1, the silicon-oxide mask layer 138 may comprise a mask layer top surface 110' and a mask layer bottom surface 106'. The mask layer top surface 110' and the mask layer bottom surface 106' may cover the top surface 110 and bottom surface 106 of the silicon wafer 136, respectively.

At block 310 and as shown at Step 2, one or more portions of the silicon-oxide mask layer 138 may be removed, such as one or more mask layer top surface features 144 and one or more mask layer bottom surface features 145 forming a mask pattern 139 (i.e., cutout portions of the silicon-oxide mask layer 138 that correspond to the features to-be-etched into the silicon wafer 136), such that particular features (e.g., the cooling fluid inlet channels 118) can be patterned in the silicon wafer 136. In some embodiments, portions of the silicon-oxide mask layer 138 may be removed from both the top surface 110 and the bottom surface 106 of the silicon wafer 136, exposing portions of the silicon wafer 136 located beneath the silicon-oxide mask layer 138. The mask layer top surface features 144 and the mask layer bottom surface features 145 may correspond to the features that will become the features of the manifold substrate 102, such as, for example, the inlet holes 108, inlet manifolds 112, auxiliary channels 114, cooling fluid inlet channels 118, and the cooling fluid outlet channels 126 (FIGS. 1A and 1B). The silicon wafer 136 and silicon-oxide mask layer 138 shown in Step 1 of FIG. 2 is cut along a midpoint line A-A of the silicon wafer 136 and silicon-oxide mask layer 138 to show the example process from inside the silicon wafer 136 and silicon-oxide mask layer 138. Some features, such as the cooling fluid outlet channels 126 and the cooling fluid inlet channels 118 are shown as dashed lines indicating the extent of the features into the thickness of the silicon wafer 136.

In the particular example embodiment shown in FIG. 2, the cooling fluid inlet channels 118 do not include cooling fluid inlet channel openings 120 that are wider near the inlet manifolds 112, however, it is to be understood that other example embodiments may include this feature.

Still referring to FIGS. 2 and 3, once the portions of the silicon-oxide mask layer 138 are removed and the portions of the silicon wafer 136 that will form the features of the manifold substrate 102 are exposed, the silicon wafer 136 may be etched at block 315. The etching process may be completed as a plurality of steps. For example, the top surface 110 of the silicon wafer 136 may be etched first and the bottom surface 106 of the silicon wafer 136 may etched second (i.e., subsequent to etching the top surface 110). As shown at Step 3, the top surface 110 of the silicon wafer 136 may be etched.

The features that are etched into the top surface 110 of the manifold substrate 102 may include, but are not limited to, the inlet manifolds 112, the auxiliary channels 114, the cooling fluid inlet channels 118, and the cooling fluid outlet channels 126. Because certain features that extend through the entire thickness of the silicon wafer 136 (e.g., the cooling fluid outlet channels 126), such features may be etched in one or more etching steps. As such, only portions of the inlet manifolds 112, the auxiliary channels 114, the cooling fluid inlet channels 118, and the cooling fluid outlet channels 126 may be etched in the top surface 110 of the manifold substrate 102, as shown at Step 3. For example, a top portion 130 of the cooling fluid outlet channels 126 may be etched into the top surface 110 of the manifold substrate 102 and a bottom portion 132 (shown at Step 6 of FIG. 2) of the cooling fluid outlet channel 126 may be etched in the manifold substrate 102 during a different step in the example process, as described herein.

The features etched into the top surface 110 of the silicon wafer 136 may be etched to a target depth plane 135 that is formed between the top surface 110 and the bottom surface 106 at a target depth 134 from the top surface 110 of the silicon wafer 136. The target depth 134 may be a fraction of the overall thickness of the silicon wafer 136. In one non-limiting example, the target depth 134 may be between about 600 micrometers and about 800 micrometers. In other embodiments, the target depth 134 may be between about 650 micrometers and about 750 micrometers. In other embodiments, the target depth 134 may be between about 675 micrometers and about 725 micrometers. In one non-limiting example, the target depth may be about 700 micrometers.

Once the features are etched into the top surface 110 of the silicon wafer 136, one or more of the features may be coated to protect the features already etched into the top surface 110 during the etching of the bottom surface 106 at block 320. As one non-limiting example of the coating process, the etched features may be coated with a metallic coating, such as, for example, an aluminum coating 142 using an aluminum sputtering process. As shown at Step 4, the aluminum coating 142 coats the exposed surfaces of the inlet manifolds 112, the top portion 130 of the cooling fluid outlet channels 126, and the cooling fluid inlet channels 118. It should be understood that surfaces of the manifold substrate 102 coated during the coating process may use a material other than aluminum as a coating. For example, the surfaces coated during the coating process may be coated using gold or silver.

After the features have been etched and coated, the silicon wafer 136 may be flipped so that one or more features may be etched into the bottom surface 106 at block 325. In some embodiments, the silicon wafer 136 may be mounted on a carrier substrate while the bottom surface 106 is etched. In the particular example embodiment shown in FIG. 2, the inlet holes 108 and the bottom portion 132 of the cooling fluid outlet channels 126 are etched into the silicon wafer 136, as shown at Step 5. Still referring to FIGS. 2 and 3, the bottom portion 132 of the cooling fluid outlet channels 126 may be etched until the bottom portion 132 meets the top portion 130 at the target depth plane 135, resulting in certain portions of the silicon wafer 136 (e.g. locations containing the cooling fluid outlet channels 126) passing through the entire thickness of the silicon wafer 136. Similarly, the inlet holes 108 may be etched into the bottom surface 106 of the silicon wafer 136 such that they interface the inlet manifolds 112, thereby forming a fluid inlet pathway through the entire thickness of the silicon wafer 136.

It should be understood that the aluminum coating 142 may remain on the exposed features of the top surface 110 during the etching of the bottom surface 106. During the etching of the bottom surface 106, etch gases or other chemical etchant may be introduced to etch one or more features into the bottom surface 106. The aluminum coating 142 may prevent the etch gas from affecting the features etched into the top surface 110. For example, the aluminum coating may act as a physical barrier (e.g., a plug), thereby preventing gas from passing through holes in the silicon wafer 136 that begin to develop as the etch gas passes through the entire thickness of the silicon wafer 136. Additionally, even if some chemical etchant is able to pass from the bottom surface 106 of the silicon wafer 136 to the top through holes etched through the thickness of the silicon wafer 136, the aluminum coating 142 may prevent the chemical etchant from reacting with the portions of the silicon wafer 136 that are covered by the aluminum coating 142.

Additionally, the chemical reactions necessary to etch the bottom surface 106 may be exothermic (i.e., generate heat within the silicon wafer 136). This heat may be concentrated in areas of the silicon wafer 136 where etching is occurring, for example, at the portions of the silicon wafer 136 that will become the inlet holes 108 and the bottom portions 132 of the cooling fluid outlet channels 126. Heat concentrations may lead to defects in the silicon wafer 136. For example, heat may cause portions of the silicon wafer 136 to expand rapidly, melt, or develop gas bubbles at the interface between the silicon wafer 136 and the aluminum coating 142 or the interface between the silicon wafer 136 and the silicon-oxide mask layer 138. Accordingly, the aluminum coating 142 may act as a heat distributing apparatus that distributes heat across the silicon wafer 136 during etching of the silicon wafer to avoid defect formation in the silicon wafer 136.

Because the aluminum coating 142 is in direct contact with the exposed features in the top surface 110 of the silicon wafer 136, heat generated in the silicon wafer 136 due to the etching of the bottom surface 106 may conduct into the aluminum coating 142. Additionally, the thermal conductivity of silicon is lower than that of aluminum and most other metals. Hence, a silicon wafer, such as the silicon wafer 136, with a metallic coating, such as the aluminum coating 142, may distribute heat better than a silicon wafer with no metallic coating. Thus, the silicon wafer 136 may have an improved heat distribution profile during the etch of the bottom surface 106 according to Step 5 and thus result in potentially fewer defects in the manifold substrate 102.

At block 330 and as shown at Step 6, the silicon wafer 136 may be removed from the carrier wafer. Any mounting oil or other substance used to mount the silicon wafer 136 to the carrier wafer may also be removed from the silicon wafer 136. The aluminum coating 142 may also be removed. In some embodiments, the aluminum coating 142 may be removed using an aluminum etchant or solvent. Subsequently, the silicon-oxide masking layer 138 may be removed from the silicon wafer 136. In some embodiments, the silicon-oxide masking layer 138 may be removed using a silicon-oxide masking layer solvent (e.g., a hydrogen-fluoride solution). The result of the process described in Steps 1-6 is a manifold substrate similar to the manifold substrate 102 depicted at Step 6 and in FIGS. 1A and 1B.

Referring now to FIGS. 4A, 4B, 4C, 5, and 6, a process for minimizing the extent and time that surface-etched features may be improperly exposed to chemical etchant are described. FIGS. 4A-4C show an example embodiment of a multi-substrate layer cooling device 200. The multi-substrate layer cooling device 200 may be used to cool a power semiconductor device, such as, for example, a SiC or GaN power semiconductor device and may include a cooling fluid flow path 202 that flows through the multi-substrate layer cooling device 200 to remove heat from the power semiconductor device.

The multi-substrate layer cooling device 200 may include a first substrate layer 204, a second substrate layer 206, and a third substrate layer 208. The first substrate layer 204 may include a top surface 210 and a bottom surface 212. The power semiconductor device (not shown) may thermally couple to the top surface 210 of the first substrate layer 204 at a cooling location 214. In some embodiments, the cooling location 214 may be metallized. Additionally, a cooling array 216 (shown in the detailed view of FIG. 4C) may be disposed on the bottom surface 212 of the first substrate layer 204. The cooling array 216 may face a nozzle array 220 located on the second substrate layer 206. The cooling location 214 may be generally aligned with the cooling array 216 on their respective surfaces 210, 212 of the first substrate layer 204 such that cooling fluid passing through one or more channels 218 etched into the cooling array 216 removes heat from a power semiconductor device thermally coupled to the multi-substrate layer cooling device 200 at the cooling location 214.

Cooling fluid may be impinged on the cooling array 216 from the nozzle array 220 etched in the second substrate layer 206. The nozzle array 220 may include one or more nozzle blocks 222 having one or more nozzle through-holes 224 that pass through the thickness of the second substrate layer 206, as particularly shown in FIG. 4B. Still referring to FIGS. 4A-4C, the nozzle array 220 may be disposed within an outlet plenum 226 that is etched into a top surface 228 of the second substrate layer 206. The second substrate layer 206 may also include a bottom surface 230 and a second substrate layer cooling fluid outlet 232 that extends through the second substrate layer from the top surface 228 to the bottom surface 230 thereof. Together, the outlet plenum 226 and the second substrate layer cooling fluid outlet 232 may form a through-substrate feature that passes through the entire thickness of the second substrate layer 206. The nozzle through-holes 224 of the nozzle array 220, the outlet plenum 226, and second substrate layer cooling fluid outlet 232 together form through-substrate features that extend through the entire thickness of the second substrate layer 206.

The third substrate layer 208 may include a top surface 234 having an inlet plenum 236 formed therein and a bottom surface 238. The third substrate layer 208 may also include a cooling fluid inlet 240. Together, the inlet plenum 236 and the cooling fluid inlet 240 may form a through-substrate feature that passes through an entire thickness of the third substrate layer 208. The third substrate layer 208 may also include a third substrate layer cooling fluid outlet 242 that may pass through the entire thickness of the third substrate layer 208 and be substantially aligned with the second substrate layer cooling fluid outlet 232.

In some embodiments, the first substrate layer 204, second substrate layer 206, and the third substrate layer 208 may be bonded together. For example, the first substrate layer 204, second substrate layer 206, and the third substrate layer 208 may be directly bonded such that the top surface 234 of the third substrate layer 208 is bonded to the bottom surface 230 of the second substrate layer 206 and the top surface 228 of the second substrate layer 206 is bonded to the bottom surface 212 of the first substrate layer 204.

The particular configuration depicted in FIGS. 4A-4C defines a particular fluid path for cooling fluid entering the multi substrate later cooling device 200. More specifically, cooling fluid may flow along the cooling fluid flow path 202. Cooling fluid may flow from an external system through the cooling fluid inlet 240 to the inlet plenum 236. The bottom surface 230 of the second substrate layer 206 may seal the inlet plenum 236, thereby preventing cooling fluid from escaping the inlet plenum 236. Said another way, the physical boundary that keeps cooling fluid from flowing out of the top of the inlet plenum 236 may be the bottom surface 230 of the second substrate layer 206. Cooling fluid may then pass through the nozzle array 220, where it is impinged on the cooling array 216. Cooling fluid may drain from the cooling array 216 to the outlet plenum 226, where it may be collected before it travels out of the multi-substrate layer cooling device 200 through the second substrate layer cooling fluid outlet 232 and the third substrate layer cooling fluid outlet 242.

Figure 5:
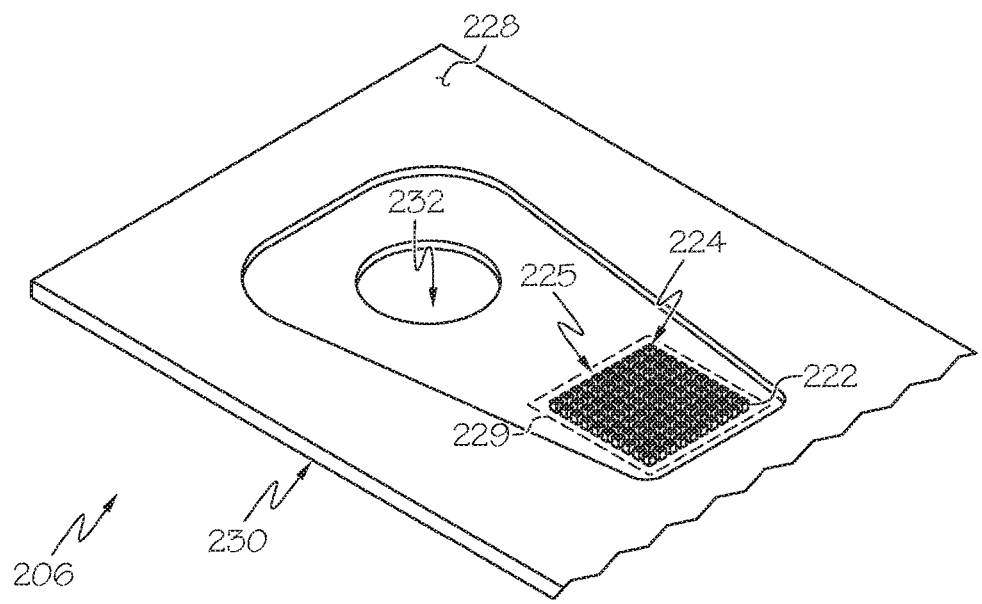
FIG. 5 schematically depicts a top surface of the second substrate layer of the multi-substrate layer cooling device of FIG. 4A, according to one or more embodiments shown and described herein.
Figure 6:
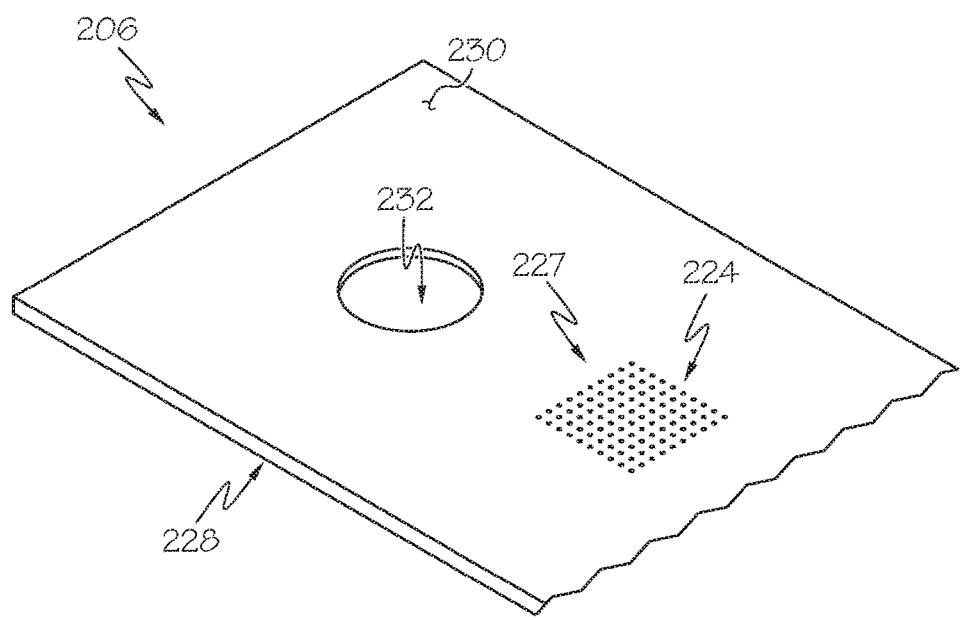
FIG. 6 schematically depicts a bottom surface of the second substrate layer of the multi-substrate layer cooling device of FIG. 4A, according to one or more embodiments shown and described herein.

Some of the herein-listed features of the example embodiment of the multi-substrate layer cooling device 200 may pass through an entire substrate layer. For example, as shown in FIGS. 5 and 6, the second substrate layer 206 may include the nozzle through-holes 224 that pass through an entire thickness of the second substrate layer 206. The second substrate layer cooling fluid outlet 232 and the outlet plenum 226 may also form a through-substrate feature through the entire thickness of the second substrate layer 206. As another non-limiting example, as shown in FIG. 4A, the cooling fluid inlet 240 and the inlet plenum 236 may form a through-substrate feature through the entire thickness of the third substrate layer 208 and the third substrate layer cooling fluid outlet 242 may be a through-hole through the entire thickness of the third substrate layer 208.

A complication associated with etching multiple through-wafer features from both sides of a wafer is that not all of the through-wafer features will be completed exactly at the same time. That is, the chemical etchant will etch completely through one or some of the features or a portion of one or some of the features before all of the features are completely etched through. For example, in the nozzle array 220 discussed with respect to FIGS. 4A and 4B herein, one or more of the individual nozzle through-holes 224 may be completed before the remainder of the nozzle through-holes 224. The time that the etchant etches through a portion of the through-wafer features may be referred to as the initial through-etch time. Depending on the composition of the etchant, in particular if a gas etchant is used, the etchant may diffuse through completed through-wafer features into features already etched into the opposite side of the silicon wafer after the initial through-etch. The already-etched portions may be exposed to chemical etchant from the initial through-etch time until an etch completion time (i.e., the time at which the etch is completed in substantially all of the features). Using the structure described herein as an example, once etching of one of the nozzle through-holes 224 is complete, gas etchant may diffuse through the completed one of the nozzle through-holes 224, exposing the outlet plenum 226 and the other features of the second substrate layer 206 to chemical etchant. However, in the particular example embodiment shown in FIGS. 5 and 6, this outcome may be avoided by etching the features in the bottom surface 230 of the second substrate layer 206 first.

Figure 7:
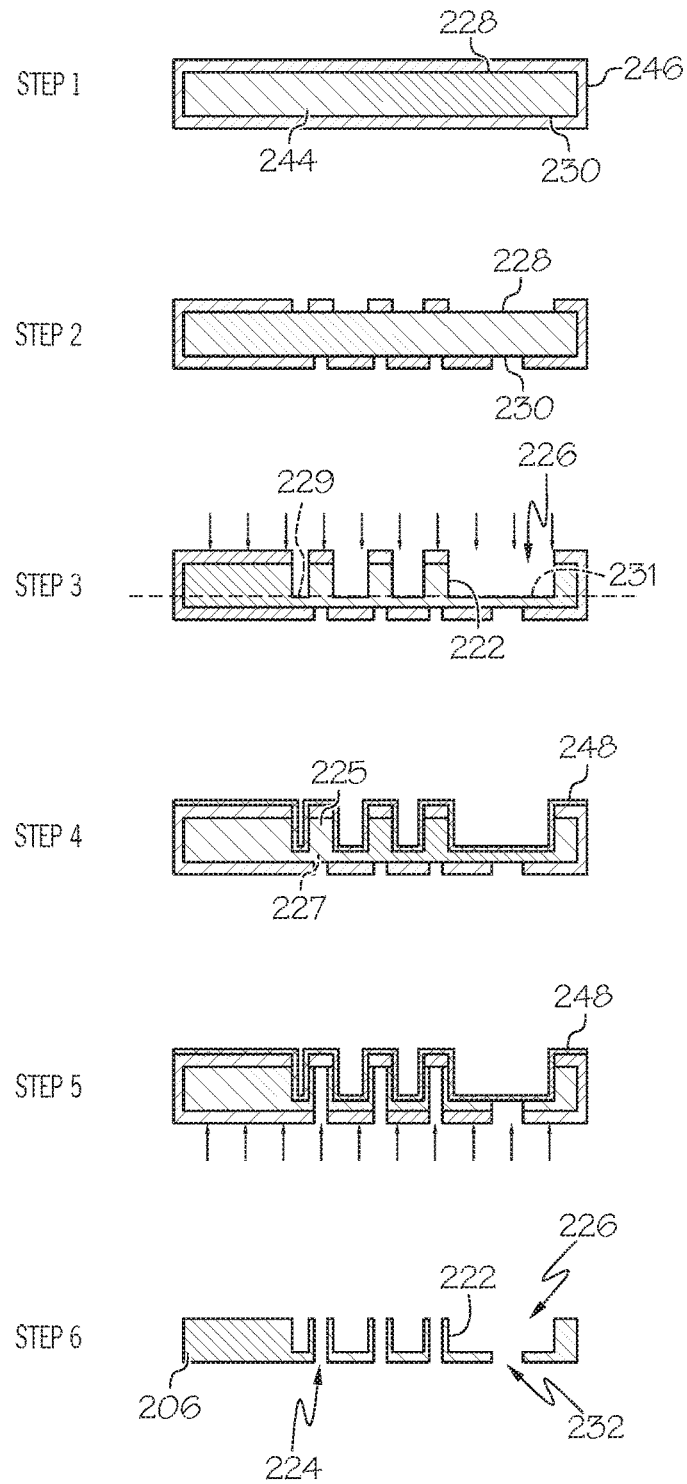
FIG. 7 schematically depicts an example process for etching the example embodiment of the multi-substrate layer cooling device of FIG. 4A, according to one or more embodiments shown and described herein.
Figure 8:
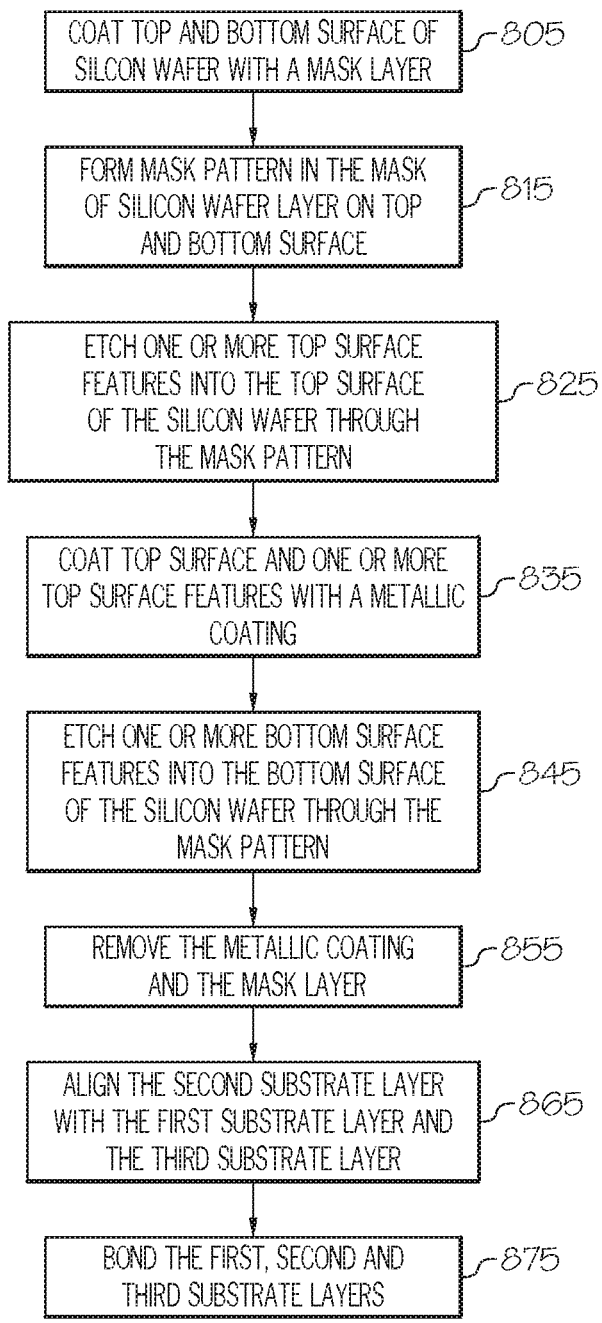
FIG. 8 depicts a flow diagram of the example process of FIG. 7, according to one or more embodiments shown and described herein.

Accordingly, FIG. 7 shows an example process for etching the features shown in the second substrate layer 206 of FIGS. 5 and 6 and FIG. 8 is a flow diagram depicting the example process. It should be understood that the particular example embodiment shown in FIGS. 5 and 6 and the example process shown in FIGS. 7-8 are merely examples and the principles disclosed herein are applicable to other etching processes. Briefly referring to Step 6 of FIG. 7, the second substrate layer 206 is schematically shown with nozzle blocks 222, nozzle through-holes 224, the outlet plenum 226, and the second substrate layer cooling fluid outlet 232 removed from the silicon wafer 244 that comprises the second substrate layer 206.

Referring now to FIGS. 7 and 8, as shown at Step 1 and described at block 805, the silicon wafer 244 may be initially coated with a silicon-oxide mask layer 246. As shown at step 2 and described at block 815, portions of the silicon-oxide mask layer 246 may be removed to expose a pattern of the silicon wafer 244 that will become the features of the second substrate layer 206. As shown at step 3 and described at block 825, the nozzle blocks 222 and the outlet plenum 226 may be etched from the top surface 228 of the silicon wafer 244. The nozzle blocks 222 and the outlet plenum 226 may be etched to a nozzle target depth 229 and a plenum target depth 231, respectively. The nozzle target depth 229 and the plenum target depth 231 may be a fraction of the total thickness of the silicon wafer 244 to which the top surface etch of the nozzle blocks 222, nozzle through-holes 224, and outlet plenum 226 may extend. In some embodiments, the nozzle target depth 229 and the plenum target depth 231 may be the same fraction of thickness of the silicon wafer 244.

As shown at step 4 and described at block 835, the features etched from the top surface 228 of the second substrate layer 206 are coated with a metallic coating (e.g., an aluminum coating 248). Once the top surface features have been etched and coated with the aluminum coating 248, the bottom surface features may be etched at block 845. As shown at step 5, the one or more nozzle through-holes 224 are etched from the bottom surface 230. As shown at step 6 and described at block 855, the silicon-oxide mask layer 244 is removed to complete the formation of the second substrate layer 206.

It should be understood that the process depicted in FIG. 7 is only one example of a process for etching a silicon wafer. The steps described may be performed in a different order or in a different manner than the specific example embodiment described. For example, the nozzle through-holes 224 may be etched partway through the second substrate layer 206 by exposing the bottom surface 230 to an etchant and then etched fully through the silicon wafer 244 by exposing the top surface 228 to an etchant. This order is shown in the process depicted in FIG. 9. More specifically, a bottom portion 227 of the nozzle through-holes 224 may be etched into the bottom surface 230 of the second substrate layer 206 before a top portion 225 of the nozzle through-holes 224 may be etched into the top surface 228 of the second substrate layer 206, as shown by blocks 925-945 of FIG. 9. The one or more top portions 225 and the one or more bottom portions 227 of the nozzle through-holes 224 may be etched through the second substrate layer 206 such that they meet at the nozzle target depth 229 or at a different depth within the thickness of the silicon wafer 244.

Similarly, the outlet plenum 226 and the second substrate layer cooling fluid outlet 232 may be etched from both sides of the silicon wafer 244 to form a through-wafer feature. More specifically, the second substrate layer cooling fluid outlet 232 may be etched into the bottom surface 230 of the second substrate layer 206 to the plenum target depth 231 before the outlet plenum 226 may be etched into the top surface 228 of the second substrate layer to a plenum target depth 231. In this way, the overall aspect ratio of each of the features, the etching time, and the difficulty of etching each of the features may be decreased.

Moreover, as depicted at block 935, a metal coating, such as the aluminum coating 248, may be coated on the bottom surface 230 of the second substrate layer 206 before the top surface features are etched. For example, once a bottom portion 229 of the nozzle through-holes 224 is etched, the bottom portion 229 of the nozzle through-holes 224 may be coated with an aluminum coating, such as aluminum coating 248, and then the top portions 227 of the nozzle through-holes 224 may be etched. Similarly, once the second substrate layer cooling fluid outlet 232 has been etched through the bottom surface 230 of the second substrate layer 206, it may be coated with an aluminum coating, such as aluminum coating 248 before the outlet plenum 226 is etched. As described herein, this may help prevent chemical etchant from diffusing throughout the features etched into the bottom surface as well as help distribute heat within the silicon wafer 244 as it is being etched. However, because the aspect ratios of the one or more features on the bottom surface 230 of the second substrate layer 206 may be relatively low (for example, when compared to the features on the top surface 228), it may be unnecessary to coat the various features on the bottom surface 230 of the second substrate layer 206 with a coating, such as aluminum coating 248, before etching the one or more features on the top surface 228 of the second substrate layer 206.

Figure 9:
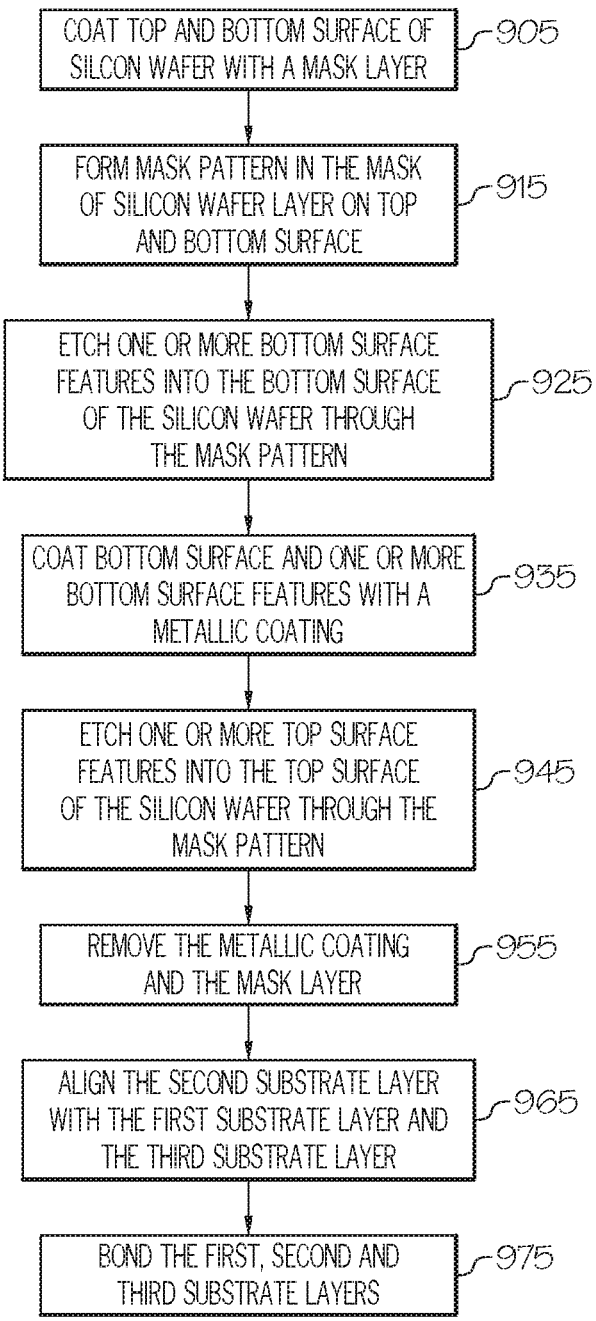
FIG. 9 depicts a flow diagram of another example process for etching the multi-substrate layer cooling device of FIG. 4A, according to one or more embodiments shown and described herein.

Moreover, by etching the bottom surface 230 of the second substrate layer 206 first, for example by using the example process described in FIG. 9, and then mounting the bottom surface 230 of the second substrate layer 206 to a carrier wafer, and then etching the top surface 228, any etchant that passes through nozzle through-holes 224 that are completed before the others will only react with the aluminum coating 248 in the bottom portion 227 of the nozzle through-hole 224 or be stopped by the aluminum coating 248 from diffusing into the bottom portion 227 of the nozzle through-hole 224 in the first place.

If the features of the second substrate layer 206 are etched from the top surface 228 first, the outlet plenum 226 and the top half of the nozzle through-holes 224 would already be etched when the bottom surface 230 is etched. As the etchant etches through the bottom surface 230 and begins to complete the second substrate layer cooling fluid outlet 232 and the nozzle through-holes 224, the etchant, especially etchant in gas form, would pass through the through-holes that are beginning to form (i.e., forming complete through-holes through the substrate layer) and the exposed surfaces of the outlet plenum 226 and the nozzle blocks 222 would react with the chemical etchant, increasing the exposure of the already-etched features. This increased exposure may degrade the quality of the etched features and functionality of the device. Moreover, because the second substrate layer 206 is mounted to the carrier substrate with mounting oil, this may expose large amounts of mounting oil to chemical etchant, generating a waste product that may bind to the substrate and could ultimately affect device performance. In order to avoid these problems, the features etched into the second substrate layer 206 may be etched first from the bottom surface 230.

It should now be understood that embodiments described herein include methods for etching features or one or more portions of features into a silicon substrate from multiple sides of the silicon substrate and coating surfaces of the silicon substrate with a passivation layer after etching through one surface of the silicon substrate before etching through an opposite-side surface of the wafer. The multi-sided etching of the silicon substrate and the introduction of a passivation layer may improve dimensional accuracy of the etch and increase the functionality of the features formed by the etch.

As used herein, the term "fluidly coupled" refers to two or more components that are in fluid communication, such that a fluid (generally referred to within the same paragraph or the context of the description of the component that is fluidly coupled) can pass between the two or more components. As used herein, the term "thermally coupled" refers to two or more components in thermal communication such that heat is transferable from the hotter component to the colder of the one or more components by one or more thermal transfer means (e.g., thermal conductivity, thermal radiation, or thermal convection).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of etching features in a silicon wafer, the method comprising:
   coating a top surface and a bottom surface of the silicon wafer with a mask layer having a lower etch rate than an etch rate of the silicon wafer;
   removing one or more portions of the mask layer to form a mask pattern in the mask layer on the top surface and the bottom surface of the silicon wafer;
   etching one or more top surface features into the top surface of the silicon wafer through the mask pattern to a target depth plane located between the top surface and the bottom surface of the silicon wafer at a depth from the top surface;
   coating the top surface and the one or more top surface features with a metallic coating; and
   etching one or more bottom surface features into the bottom surface of the silicon wafer through the mask pattern to the target depth plane.

2. The method of claim 1, further comprising mounting the silicon wafer to a carrier substrate before etching the one or more bottom surface features.

3. The method of claim 1, wherein the one or more top surface features are selected from one or more inlet manifolds, one or more auxiliary channels, one or more cooling fluid inlet channels, and one or more top portions of one or more cooling fluid outlet channels.

4. The method of claim 3, wherein:
   the mask pattern comprises one or more mask layer top surface features that are removed from a mask layer top surface, and
   the mask layer top surface features correspond to the one or more inlet manifolds and the one or more top portions of the one or more cooling fluid outlet channels.

5. The method of claim 1, wherein the one or more bottom surface features are selected from one or more inlet holes and one or more bottom portions of one or more cooling fluid outlet channels.

6. The method of claim 5, wherein:
the mask pattern comprises one or more mask layer bottom surface features that are removed from a mask layer bottom surface located on the bottom surface of the silicon wafer, and
the mask layer bottom surface features correspond to the one or more inlet holes and the one or more bottom portions of the one or more cooling fluid outlet channels.

7. The method of claim 1, wherein the one or more top surface features and the one or more bottom surface features are etched using anisotropic deep silicon etching.

8. The method of claim 1, wherein the metallic coating is aluminum.

9. The method of claim 8, wherein coating the top surface and the one or more top surface features comprises coating via an aluminum sputtering process.

10. A method of etching one or more features in a silicon wafer, the method comprising:
coating a top surface and a bottom surface of the silicon wafer with a mask layer having a lower etch rate than an etch rate of the silicon wafer;
removing one or more portions of the mask layer to form a mask pattern in the mask layer on the top surface and the bottom surface of the silicon wafer;
etching one or more bottom surface features into the bottom surface of the silicon wafer through the mask pattern to a target depth plane located between the top surface and the bottom surface of the silicon wafer at a target depth from the top surface;
coating the bottom surface and the one or more bottom surface features etched into the bottom surface with a metallic coating; and
etching one or more top surface features into the top surface of the silicon wafer through the mask pattern to the target depth plane.

11. The method of claim 10, further comprising mounting the silicon wafer to a carrier substrate before etching the one or more features into the top surface of the silicon wafer.

12. The method of claim 10, wherein the metallic coating is an aluminum coating.

13. The method of claim 10, wherein coating the bottom surface and the one or more bottom surface features comprises coating via an aluminum sputtering process.

14. The method of claim 10, wherein the one or more features are etched using an anisotropic silicon etching technique.

15. A method of etching one or more through-features into a silicon wafer comprising a top surface and a bottom surface and coated in a mask layer, wherein the one or more through-features comprise one or more nozzle through-holes, an outlet plenum, and a cooling fluid outlet, the method comprising:
forming a mask pattern in a mask layer top surface and a mask layer bottom surface of the mask layer;
etching a bottom portion of the one or more nozzle through-holes from the bottom surface to a nozzle target depth through the mask layer bottom surface;
etching the cooling fluid outlet from the bottom surface to a plenum target depth through the mask layer top surface;
coating the bottom surface and the bottom portion of the one or more nozzle through-holes and the cooling fluid outlet with a metallic coating;
etching a top portion of the one or more nozzle through-holes from the top surface to the nozzle target depth; and
etching the outlet plenum from the top surface to the plenum target depth, wherein:
the first of the one or more through-features to etch through the silicon wafer is completed at an initial through-etch time, and
the last of the one or more through-features to etch through the silicon wafer is completed at an etch completion time.

16. The method of claim 15, wherein the mask layer top surface and the mask layer bottom surface comprise silicon oxide.

17. The method of claim 15, wherein before the top portion of the one or more nozzle through-holes and the outlet plenum are etched into the top surface of the silicon wafer, the bottom portion of the one or more nozzle through-holes and the cooling fluid outlet are filled with mounting oil.

18. The method of claim 15, wherein the metallic coating comprises an aluminum coating.

19. The method of claim 18, wherein coating the bottom surface comprises coating via an aluminum sputtering process.

20. The method of claim 15, wherein the nozzle target depth and the plenum target depth are substantially equivalent depths through the thickness of the silicon wafer.

* * * * *

UNITED STATES PATENT AND TRADEMARK OFFICE
CERTIFICATE OF CORRECTION

PATENT NO. : 10,395,940 B1
APPLICATION NO. : 15/919889
DATED : August 27, 2019
INVENTOR(S) : Feng Zhou et al.

Page 1 of 1

It is certified that error appears in the above-identified patent and that said Letters Patent is hereby corrected as shown below:

In the Specification

In Column 5, Line 39, after "to", delete "." and insert --,--, therefor.

Signed and Sealed this
Eighth Day of October, 2019

Andrei Iancu
*Director of the United States Patent and Trademark Office*